US009699895B2

(12) United States Patent
Kato

(10) Patent No.: US 9,699,895 B2
(45) Date of Patent: Jul. 4, 2017

(54) FLEXIBLE BOARD AND ELECTRONIC DEVICE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/372,474

(22) Filed: Dec. 8, 2016

(65) Prior Publication Data
US 2017/0094777 A1    Mar. 30, 2017

Related U.S. Application Data

(63) Continuation of application No. 14/305,539, filed on Jun. 16, 2014, now Pat. No. 9,554,461, which is a continuation of application No. PCT/JP2013/081418, filed on Nov. 21, 2013.

(30) Foreign Application Priority Data

Jan. 8, 2013   (JP) ................. 2013-001098

(51) Int. Cl.
| H05K 1/00 | (2006.01) |
| H05K 1/02 | (2006.01) |
| H05K 1/14 | (2006.01) |
| H05K 1/11 | (2006.01) |
| H04M 1/02 | (2006.01) |

(52) U.S. Cl.
CPC .......... *H05K 1/028* (2013.01); *H05K 1/0228* (2013.01); *H05K 1/0237* (2013.01); *H05K 1/115* (2013.01); *H05K 1/147* (2013.01); H04M 1/026 (2013.01); H05K 2201/10037 (2013.01)

(58) Field of Classification Search
CPC .................. H05K 1/028; H05K 1/147; H05K 2201/10037
USPC .................. 174/254, 525; 361/749
See application file for complete search history.

(56) References Cited

U.S. PATENT DOCUMENTS

| 8,749,986 B1 * | 6/2014 | Peterson ................ H05K 1/117 174/254 |
| 2012/0097433 A1 * | 4/2012 | Kato ....................... H01P 3/081 174/254 |

OTHER PUBLICATIONS

Kato, "Flexible Board and Electronic Device", U.S. Appl. No. 14/305,539, filed Jun. 16, 2014.

* cited by examiner

*Primary Examiner* — Sherman Ng
(74) *Attorney, Agent, or Firm* — Keating & Bennett, LLP

(57) ABSTRACT

A flexible board includes a first sheet section including a first principal surface, a second sheet section including a second principal surface and provided in a different position from the first principal surface in a normal direction to the first principal surface, at least one first bent sheet section configured to connect ends of the first and second sheet sections, the first bent sheet section including a third principal surface not parallel to the first and second principal surfaces, and at least two second bent sheet sections each including a fourth principal surface and provided in different positions from the third principal surface in a normal direction to the third principal surface. The second bent sheet sections are positioned so as to sandwich the first bent sheet section therebetween when viewed in a plan view in the normal direction to the third principal surface.

6 Claims, 11 Drawing Sheets

F I G. 1
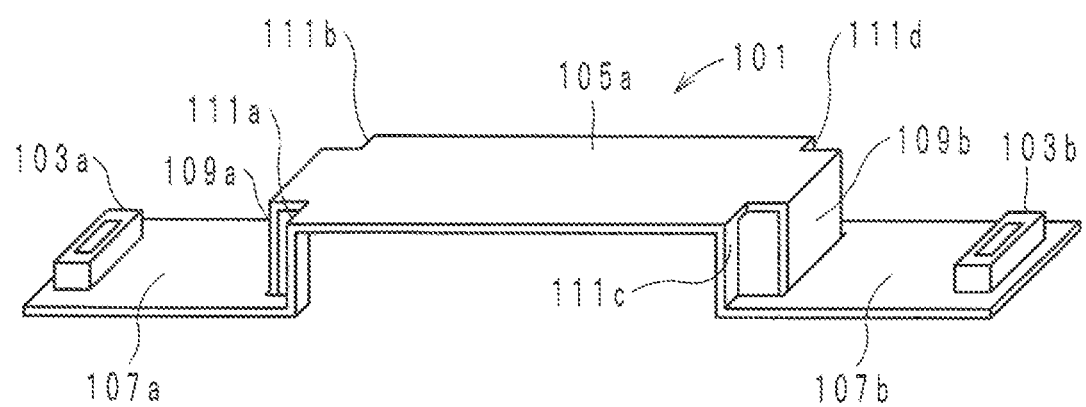
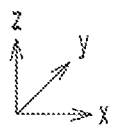

FLEXIBLE BOARD AND ELECTRONIC DEVICE

This application is based on Japanese Patent Application No. 2013-001098 filed on Jan. 8, 2013 and International Application No. PCT/JP2013/081418 filed on Nov. 21, 2013, the entire contents of each of which is incorporated herein by reference.

BACKGROUND OF THE INVENTION

1. Field of the Invention

The present invention relates to a flexible board bent at predetermined positions and an electronic device including the same.

2. Description of the Related Art

A conventional flexible board of this type is described in, for example, International Publication No. WO2012/073591. As shown in FIG. 11, the flexible board 50 described in International Publication No. WO2012/073591 includes a flexible base 501 and a plurality of external terminals 503.

The base 501 includes a plurality of dielectric sheets. Each dielectric sheet is made of flexible, thermoplastic resin such as polyimide or liquid crystal polymer. Moreover, the dielectric sheet, when viewed in a plan view in a direction z (referred to below as a normal direction z) parallel to a line normal to its principal surface, is in the shape of a rectangle extending in a direction x perpendicular to the normal direction z. The base 501 is formed by laminating the dielectric sheets in the normal direction z. In addition, signal lines and ground conductors are provided in or on the base 501 during the course of lamination.

The external terminals 503 are rectangular conductors positioned at opposite ends of the base 501 in the perpendicular direction x, and used as, for example, signal terminals or ground terminals. These conductors are made of a metal material, preferably, a metal foil, mainly composed of silver or copper and including a low specific resistance.

The flexible board 50 is used for electrically connecting two high-frequency circuits within the housing of an electronic device by the external terminals 503. In the housings of electronic devices of recent years, various components and modules are integrated with high density. To place the flexible board 50 in such a housing, the flexible board 50 is bent in accordance with the shape of the space in which it is to be placed. In the example of FIG. 11, the flexible board 50 is bent at four portions A to D, resulting in a first sheet section 505a, second sheet sections 507a and 507b, and bent sheet sections 509a and 509b.

The first sheet section 505a is a center portion of the flexible board 50, and is positioned at a different level from the second sheet sections 507a and 507b in the normal direction z. A first end of the first sheet section 505a in the perpendicular direction x (namely, bend B) is connected to a first end of the bent sheet section 509a. In addition, a second end of the first sheet section 505a (namely, bend C) is connected to a first end of the bent sheet section 509b.

Furthermore, the second sheet section 507a is positioned on the negative side of the flexible board 50 in the perpendicular direction x, and is typically fixed within the housing. The second sheet section 507a has at least one of the external terminals 503 provided at its first end in the perpendicular direction x, and is connected at a second end (namely, bend A) to a second end of the bent sheet section 509a.

Furthermore, the second sheet section 507b is positioned on the positive side of the flexible board 50 in the perpendicular direction x, and is typically fixed within the housing. The second sheet section 507b has at least one of the external terminals 503 provided at its first end in the perpendicular direction x, and is connected at a second end (namely, bend D) to a second end of the bent sheet section 509b.

The bent sheet section 509a is connected between the first sheet section 505a and the second sheet section 507a so as to be perpendicular thereto. The bent sheet section 509b is connected between the first sheet section 505a and the second sheet section 507b so as to be perpendicular thereto.

However, depending on the bending manner, high-frequency characteristics (in particular, isolation) might vary between individual flexible boards 50 housed in a plurality of electronic devices. For example, the bent sheet sections 509a and 509b are flexible and extend in the normal direction z, and further, the first sheet section 505a is connected on top of both of them. Accordingly, as the size of the first sheet section 505a increases, the shape of the bent sheet sections 509a and 509b becomes unstable. As a result, for example, the signal lines in the bent sheet section 509a might be positioned closer to the signal lines in another sheet section or an external high-frequency circuit, causing crosstalk between them. In addition, the first sheet section 505a might be deflected, for example, under its own weight, causing crosstalk.

SUMMARY OF THE INVENTION

A flexible board according to a preferred embodiment of the present invention includes a first sheet section including a first principal surface, a second sheet section including a second principal surface and provided in a different position from the first principal surface in a normal direction to the first principal surface, at least one first bent sheet section configured to connect ends of the first and second sheet sections, the first bent sheet section including a third principal surface not parallel to the first and second principal surfaces, and at least two second bent sheet sections each including a fourth principal surface and provided in different positions from the third principal surface in a normal direction to the third principal surface. The second bent sheet sections are positioned so as to sandwich the first bent sheet section therebetween when viewed in a plan view in the normal direction to the third principal surface.

An electronic device according to another preferred embodiment of the present invention includes the flexible board according to the above preferred embodiment and at least two high-frequency circuits connected by the flexible board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an oblique view illustrating a flexible board according to a preferred embodiment of the present invention.

DETAILED DESCRIPTION OF THE PREFERRED EMBODIMENTS

Figure 2:
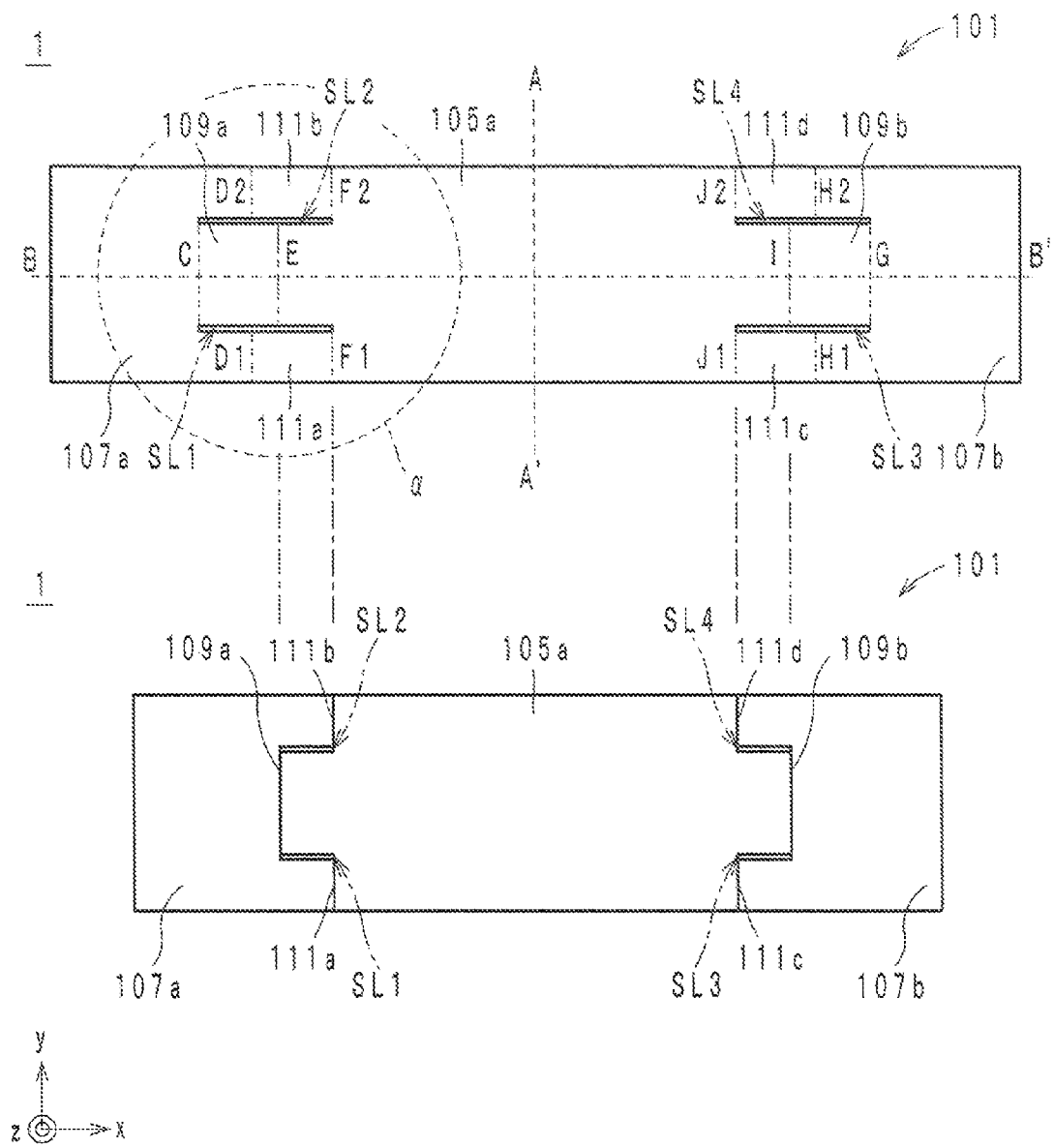
FIG. 2 provides top views of the flexible board shown in FIG. 1 (before and after bending).
Figure 3:
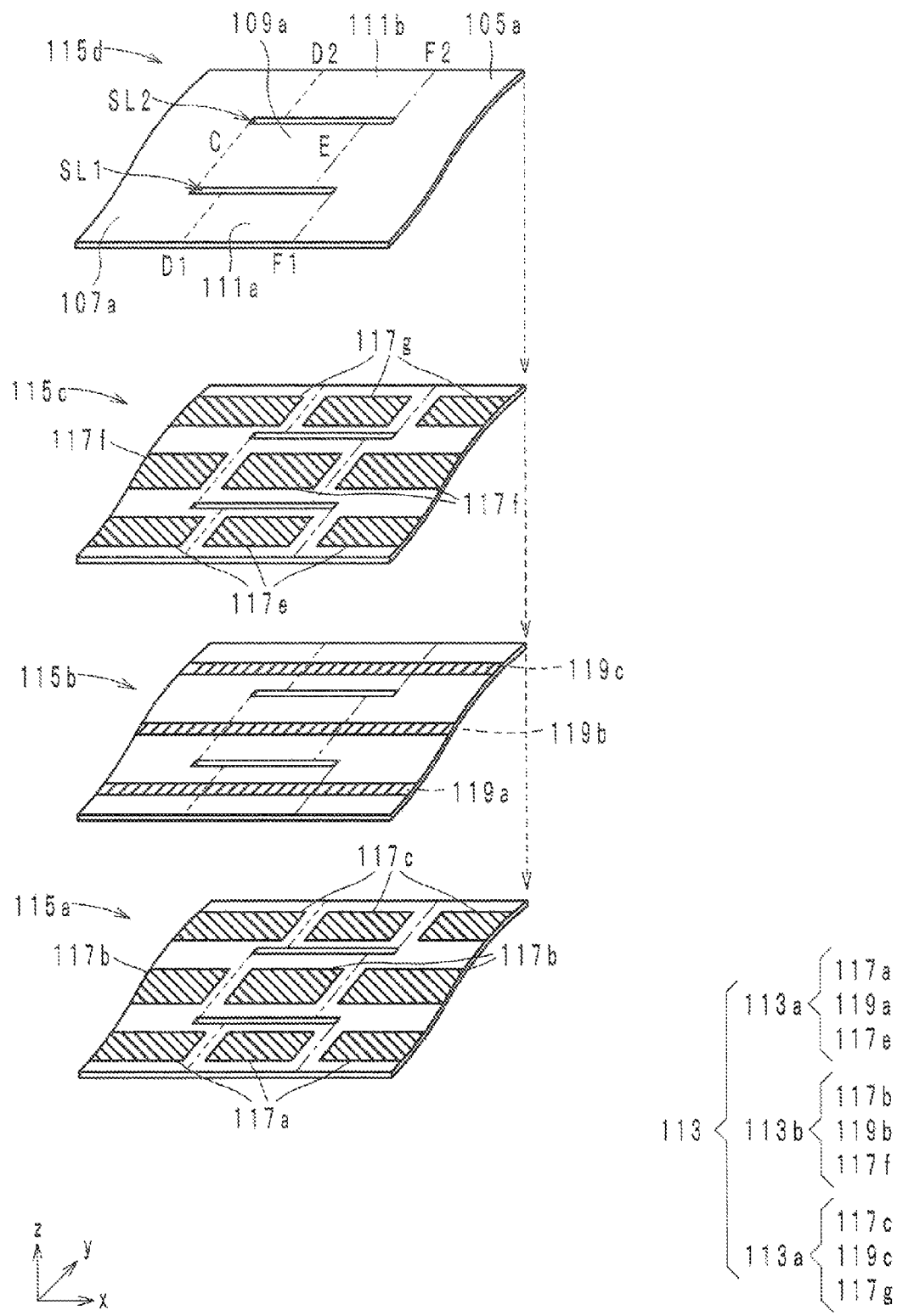
FIG. 3 is an exploded view illustrating in enlargement a portion shown in a dotted circle of FIG. 2.

FIG. 1 is an oblique view illustrating the configuration of a flexible board 1 according to a preferred embodiment of the present invention. FIG. 2 provides top views of the flexible board 1 shown in FIG. 1, where the upper portion shows the flexible board 1 before bending, and the lower portion shows the flexible board 1 after bending. FIG. 3 is an exploded view illustrating in enlargement the structure of the flexible board 1 in circle α of FIG. 2.

In FIGS. 1 to 3, the x-axis represents the right-left direction (longitudinal direction) of the flexible board 1. The y-axis represents the front-rear direction of the flexible board 1. The z-axis represents the top-bottom direction of the flexible board 1. Further, the z-axis also represents the direction of lamination of the flexible sheets in the flexible board 1 before bending.

The flexible board 1 is preferably configured to connect at least two high-frequency circuits and/or components within the housing of an electronic device, such as a cell phone or a smartphone, for example. In electronic devices of recent years, various components and modules are disposed with high density. To place the flexible board 1 in such an electronic device, the flexible board 1 is bendable in accordance with the shape of the space in which it is to be placed, and the flexible board 1 generally includes a sheet-shaped base 101 and connectors 103a and 103b, as shown in FIG. 1.

The base 101 preferably is made of a dielectric material, and has a rectangular or substantially rectangular shape extending in the x-axis direction when viewed in a plan view in the z-axis direction before bending, as shown in the upper part of FIG. 2. More specifically, the base 101 preferably is composed of flexible, thermoplastic resin, such as polyimide or liquid crystal polymer, for example, so as to be bendable.

Here, the base 101 includes a pair of slits SL1 and SL2 and another pair of slits SL3 and SL4 provided in relation to bending positions. The slit SL1 is preferably configured to define a line parallel or substantially parallel to the x-axis direction, including a predetermined length 1 in the x-axis direction and a predetermined width w (where w<<1) in the y-axis direction, and extending completely through the base 101 in the z-axis direction. The predetermined length 1 is determined appropriately on the basis of the shape of the space in which the flexible board 1 is placed.

The plane that passes through the center of the base 101 in the x-axis direction and is parallel to the yz plane will be referred to herein as vertical center plane A-A'. Also, the plane that passes through the center of the base 101 in the y-axis direction and is parallel to the zx plane will be referred to herein as horizontal center plane B-B'. The slit SL2 is plane-symmetrical to the slit SL1 with respect to horizontal center plane B-B'. In addition, the slits SL3 and SL4 are plane-symmetrical to the slits SL1 and SL2, respectively, with respect to vertical center plane A-A'.

Bending lines C, D1, D2, E, F1, and F2 are defined around the slits SL1 and SL2. Bending line C is an imaginary line extending between the ends of the slits SL1 and SL2 that are located on the negative side in the x-axis direction. Bending line F1 is an imaginary line extending across the shortest distance between the end of the slit SL1 that is located on the positive side in the x-axis direction and one of the two edges of the base 101 that are parallel or substantially parallel to the x-axis, the edge being located on the negative side in the y-axis direction. Bending line F2 is an imaginary line positioned so as to be plane-symmetrical to bending line F1 with respect to horizontal center plane B-B'. Bending line E is an imaginary line positioned on the positive side in the x-axis direction relative to bending line C so as to be parallel or substantially parallel thereto at a predetermined distance of Δa. Bending lines D1 and D2 are imaginary lines positioned on the negative side in the x-axis direction relative to bending lines F1 and F2, respectively, so as to be parallel or substantially parallel thereto at the predetermined distance of Δa.

Furthermore, bending lines G, H1, H2, I, J1, and J2 are defined around the slits SL3 and SL4. Bending line G is an imaginary line positioned so as to be plane-symmetrical to bending line C with respect to vertical center plane A-A'. Bending lines J1 and J2 are imaginary lines positioned so as to be plane-symmetrical to bending lines F1 and F2, respectively, with respect to vertical center plane A-A'. Bending line I is an imaginary line positioned so as to be plane-symmetrical to bending line E with respect to vertical center plane A-A'. Bending lines H1 and H2 are imaginary lines positioned so as to be plane-symmetrical to bending lines D1 and D2, respectively, with respect to vertical center plane A-A'.

The base 101 is bent along bending lines C, D1, D2, E, F1, and F2. More specifically, the base 101 is bent approximately 90° outward along bending lines F1 and F2. Moreover, the base 101 is bent approximately 90° outward along bending line E as well. Here, the "outward" bending refers to a bending method by which the bend protrudes toward the positive side in the z-axis when it is viewed down from the positive side in the z-axis direction toward the negative side. Further, the base 101 is bent approximately 90° inward along bending lines D1 and D2. Moreover, the base 101 is bent approximately 90° inward along bending line C as well. Here, the "inward" bending refers to a bending method by which the bend protrudes in the opposite direction to the "outward" bending, i.e., toward the negative side in the z-axis.

Furthermore, the base 101 is bent along bending lines G, H1, H2, I, J1, and J2 so as to possess symmetry with respect to vertical center plane A-A'.

The base 101 bent as described above is shown both in FIG. 1 and the lower portion of FIG. 2. The above bending results in the base 101 including a first sheet section 105a, second sheet sections 107a and 107b, first bent sheet sections 109a and 109b, and second bent sheet sections 111a to 111d.

The first sheet section 105a is an area enclosed by the two edges of the base 101 that are parallel or substantially parallel to the x-axis, bending lines E, F1, F2, I, J1, and J2, and the slits SL1 to SL4, and includes a first principal surface parallel or substantially parallel to the xy plane.

The second sheet section 107a is an area enclosed by the two edges of the base 101 that are parallel or substantially parallel to the x-axis, one of the two edges of the base 101 that are parallel or substantially parallel to the y-axis, precisely, the edge being located on the negative side in the x-axis direction, bending lines C, D1, and D2, and the slits SL1 and SL2. The second sheet section 107a includes a second principal surface parallel to the xy plane at the distance of $\Delta a$ from the first principal surface in the z-axis direction (i.e., in the normal direction to the first principal surface).

Furthermore, the second sheet section 107b is plane-symmetrical or substantially plane-symmetrical to the second sheet section 107a with respect to vertical center plane A-A', and therefore, any detailed description thereof will be omitted.

The first bent sheet section 109a is an area enclosed by the slits SL1 and SL2 and bending lines C and E, and includes a third principal surface not parallel to either the first principal surface or the second principal surface. In the present embodiment, the third principal surface is a plane perpendicular to both the first principal surface and the second principal surface and parallel to the yz plane.

Furthermore, the first bent sheet section 109b is plane-symmetrical or substantially plane-symmetrical to the first bent sheet section 109a with respect to vertical center plane A-A', and therefore, any detailed description thereof will be omitted.

The second bent sheet section 111a is an area enclosed by one of the two edges of the base 101 that are parallel or substantially parallel to the x-axis, precisely, the edge being located on the negative side in the y-axis direction, bending lines D1 and F1, and the slit SL1. The second bent sheet section 111a has a fourth principal surface parallel to the third principal at a distance of $(1-\Delta a)$ from the third principal surface in the x-axis direction (i.e., in the normal direction to the third principal surface).

Furthermore, the second bent sheet section 111b is plane-symmetrical or substantially plane-symmetrical to the second bent sheet section 111a with respect to horizontal center plane B-B', and therefore, any detailed description thereof will be omitted. Moreover, the second bent sheet sections 111c and 111d are plane-symmetrical or substantially plane-symmetrical to the second bent sheet sections 111a and 111b, respectively, with respect to vertical center plane A-A', and therefore, any detailed descriptions thereof will be omitted.

Furthermore, in the above configuration, the first bent sheet section 109a is positioned between the second bent sheet sections 111a and 111b in a plan view in the x-axis direction (i.e., the normal direction to the third or fourth principal surface). Similarly, the first bent sheet section 109b is positioned between the second bent sheet sections 111c and 111d in a plan view in the x-axis direction. In this manner, the third principal surface protrudes toward the negative side in the x-axis direction relative to the fourth principal surface.

Furthermore, the base 101 includes at least one transmission line 113 provided therein. The transmission line 113 is configured to transmit a high-frequency signal between the connectors 103a and 103b, and extends in the x-axis direction. In the present preferred embodiment, three tri-plate striplines 113a to 113c preferably are provided as the transmission line 113, for example, as illustrated in FIG. 3. In this case, the base 101 is a multilayer board preferably formed by laminating at least four flexible sheets 115a to 115d toward the positive side in the z-axis direction.

The flexible sheets 115a to 115d are laminate members made of thermoplastic resin as mentioned above, and have the slits SL1 to SL4 provided therein. Moreover, the flexible sheets 115a to 115d are bent along bending lines C to J2, as described above. Note that in FIG. 3, reference characters are assigned only to the slits and the bending lines of the flexible sheet 115d for the sake of convenience.

The flexible sheet 115a preferably includes three ground conductors 117a to 117c arranged in the y-axis direction on the principal surface that is located on the positive side in the z-axis direction (referred to below as the top surface).

Here, in the case of the flexible board 1, for example, the ground conductor 117a is not provided across bending lines D1 and F1. Accordingly, the ground conductor 117a is divided into three conductor portions in and around the second bent sheet section 111a. In the present preferred embodiment, the ground conductor 117a including a plurality of such conductor portions is considered as one entity. The same applies to the other ground conductors 117b, 117c and 117e to 117g.

The ground conductors 117a to 117c preferably are made of, for example, a metal material mainly composed of silver or copper and including a low specific resistance. More preferably, the ground conductors 117a to 117c are made of a metal foil mainly composed of silver or copper. Here, to allow the base 101 to be bent readily, it is preferable that the ground conductors 117a to 117c not be provided on bending lines C, D1, D2, E, F1, and F2.

The flexible sheet 115b preferably includes three signal lines 119a to 119c arranged in the y-axis direction on the top surface. The signal lines 119a to 119c have a narrower width than the ground conductors 117a to 117c. Moreover, in a plan view in the z-axis direction, the signal lines 119a to 119c are positioned between the two edges of their respectively corresponding ground conductors 117a to 117c that are parallel or substantially parallel to the x-axis. The signal lines 119a to 119c are made of a material similar to that of the ground conductors 117a to 117c. The signal lines 119a to 119c are preferably configured for use in, for example, connecting an antenna and an RF circuit. The signal line 119a is configured to transmit a signal in the frequency range for use in, for example, a first wireless LAN (5 GHz). The signal line 119b is configured to transmit a signal in the frequency range for use in, for example, a second wireless LAN (2.4 GHz). The signal line 119c is configured transmit a signal in the frequency range for use in, for example, a cellular network (700 MHz to 2.7 GHz).

The flexible sheet 115c is configured essentially in the same manner as the flexible sheet 115a, and preferably includes three ground conductors 117e to 117g provided on the top surface. The ground conductor 117e is connected to the ground conductor 117a by corresponding interlayer connection conductors (not shown) in the first sheet section 105a, the second sheet sections 107a and 107b, and the second bent sheet sections 111a and 111c. The ground conductor 117f is connected to the ground conductor 117b by corresponding interlayer connection conductors (not shown) in the first sheet section 105a, the second sheet sections 107a and 107b, and the first bent sheet sections 109a and 109b. The ground conductor 117g is connected to the ground conductor 117c by corresponding interlayer connection conductors (not shown) in the first sheet section 105a, the second sheet sections 107a and 107b, and the second bent sheet sections 111b and 111d.

In the above configuration, the signal lines 119a to 119c are positioned between the flexible sheets 115b and 115c. Moreover, the ground conductor 117a is exactly opposite to the ground conductor 117e in the z-axis direction, with the flexible sheet 115b, the signal line 119a, and the flexible sheet 115c positioned therebetween. Similarly, the ground conductors 117b and 117c are exactly opposite to the ground conductors 117f and 117g, respectively, with the signal lines 119b and 119c, etc., positioned therebetween.

The portion of the transmission line 113 shown in circle α, which is located on the negative side in the x-axis direction relative to vertical center plane A-A', has been described above. The transmission line 113 possesses symmetry with respect to vertical center plane A-A', and therefore, will not be described concerning the structure on the positive side in the x-axis direction.

The connectors 103a and 103b are positioned at opposite ends of the base 101, more specifically, at the ends that are located on the negative and positive sides, respectively, in the x-axis direction. The connectors 103a and 103b are electrically connected to respective ends of the transmission line 113.

A non-limiting example of a method for producing the flexible board 1 will be described below. While the following description focuses on one flexible board 1 as an example, in actuality, large-sized flexible sheets preferably are laminated and cut, so that a number of flexible boards 1 are produced at the same time.

Prepared first are large-sized flexible sheets with their entire front surfaces copper-foiled. Next, via-holes are bored through predetermined ones of the large-sized flexible sheets by irradiating their bottom surfaces (i.e., surfaces that are not copper-foiled) with laser beams where via-hole conductors are to be formed.

Next, ground conductors 117a to 117c are formed in one of the large-sized flexible sheets by photolithography, resulting in a flexible sheet 115a for an individual flexible board 1. Similarly, signal lines 119a to 119c are formed on another large-sized flexible sheet, resulting in a flexible sheet 115b for the individual flexible board 1. In addition, ground conductors 117e to 117g are formed in still another large-sized flexible sheet, resulting in a flexible sheet 115c for the individual flexible board 1. Further, land electrodes and wiring patterns for mounting connectors 103a and 103b are formed on yet another large-sized flexible sheet, resulting in a flexible sheet 115d for the individual flexible board 1.

Next, via-hole conductors are formed by filling the via-holes provided in the predetermined large-sized flexible sheets with a conductive paste mainly composed of copper.

Next, the large-sized flexible sheets are stacked in order, from the negative side to the positive side in the z-axis direction: the flexible sheets 115a, 115b, 115c, and 115d. The stacked flexible sheets are then pressed from above and below for bonding. Subsequently, slits SL1 to SL4 are provided in the bonded flexible sheets, and then, connectors 103a and 103b are mounted on the sheets. Thereafter, the flexible board 1 is completed by bending in the manner as described above.

Figure 4A:
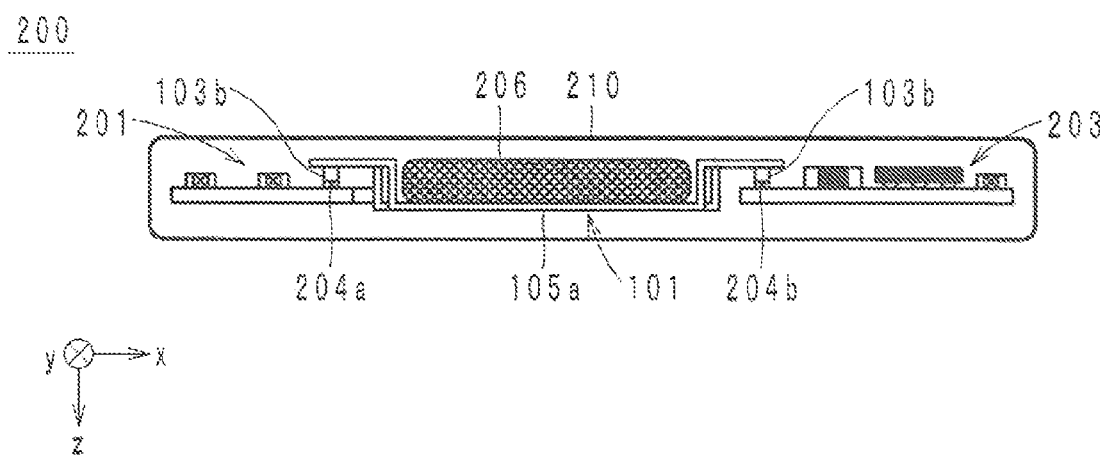
FIG. 4A is a side view illustrating the internal configuration of an electronic device to which the flexible board shown in FIG. 1 is applied.
Figure 4B:
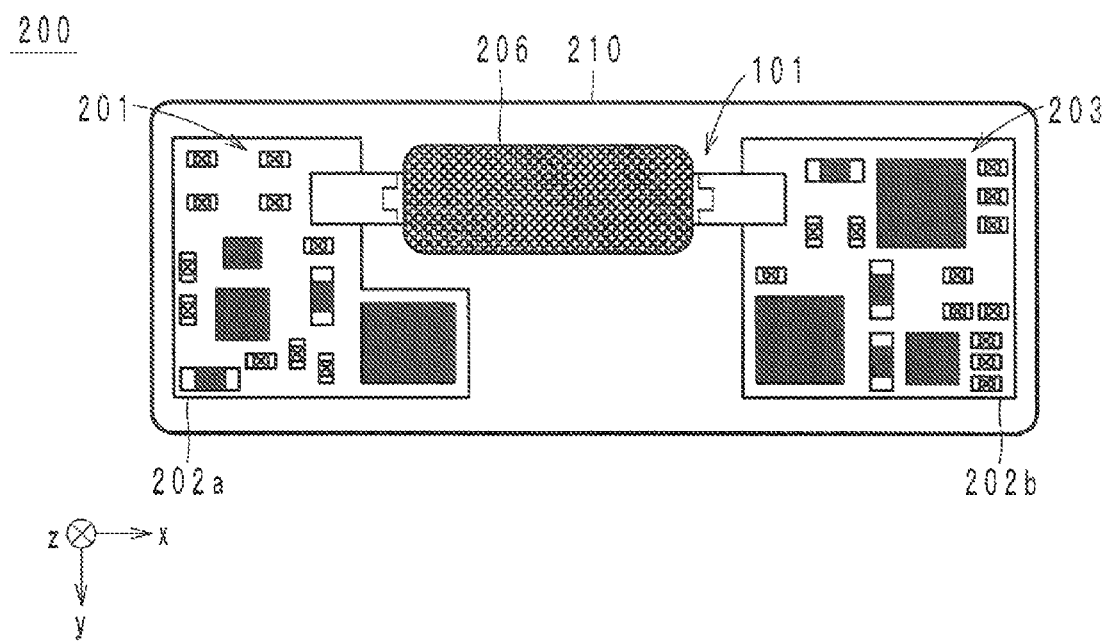
FIG. 4B is a top view illustrating the internal configuration of the electronic device shown in FIG. 4A.

The flexible board 1 configured as described above electrically connects two high-frequency circuits within the housing of an electronic device, as mentioned earlier. FIG. 4A illustrates an example of an electronic device 200 to which the flexible board 1 is applied, as viewed in a plan view in the y-axis direction. FIG. 4B illustrates the electronic device 200 of FIG. 4A in a plan view from the negative side in the z-axis direction.

In FIGS. 4A and 4B, the electronic device 200 includes the flexible board 1, circuit boards 202a and 202b, receptacles 204a and 204b, a battery pack (metallic body) 206, and a housing 210.

The housing 210 accommodates the flexible board 1, the circuit boards 202a and 202b, the receptacles 204a and 204b, and the battery pack 206.

The circuit board 202a includes circuits (e.g., various passive and active components), which constitute at least a portion of a first high-frequency circuit 201. The first high-frequency circuit 201 is provided with, for example, an antenna.

The circuit board 202b includes circuits (e.g., various passive and active components), which constitute at least a portion of a second high-frequency circuit 203. An example of the second high-frequency circuit 203 is a transmission or reception circuit.

The battery pack 206 is, for example, a lithium-ion secondary battery, and the surface thereof is wrapped by a metal cover.

The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, that are located on the negative side in the z-axis direction. The receptacles 204a and 204b are connected to the connectors 103a and 103b of the flexible board 1. Accordingly, signals transmitted between the circuit boards 202a and 202b are applied to the connectors 103a and 103b via the receptacles 204a and 204b. In this manner, the flexible board 1 connects the circuit boards 202a and 202b.

Furthermore, the flexible board 1 is bent along each bending line (see FIG. 2) so as to follow the surface profile of the battery pack 206 and contact the battery pack 206 on the surface of the first sheet section 105a. In addition, in the example shown in FIGS. 4A and 4B, the principal surface of the first sheet section 105a on the negative side in the z-axis direction is fixed on the surface of the battery pack 206 on the positive side in the z-axis direction by an adhesive or the like.

Figure 11:
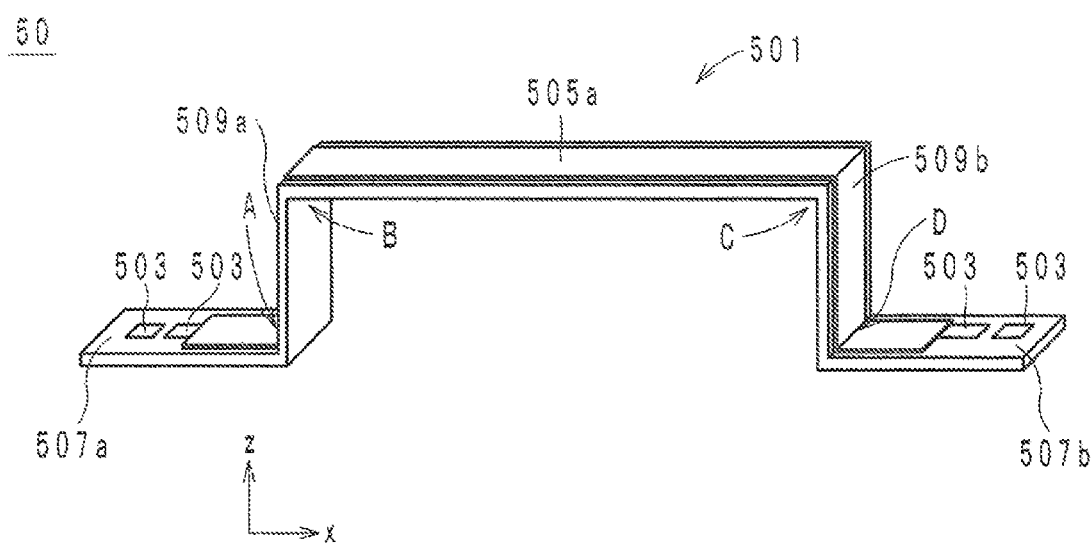
FIG. 11 is an oblique view illustrating a conventional flexible board.

As is apparent from FIG. 11, in the conventional flexible board 50, the bent sheet sections 509a and 509b, which are thin and planar, are connected to opposite ends of the first sheet section 505a. In other words, each end of the first sheet section 505a is supported by substantially one plane. Accordingly, the shape of the bent sheet sections 509a and 509b becomes unstable because of the weight and the size of the first sheet section 505a, shaking of the electronic device, etc., so that the signal lines in the bent sheet section 509a might be positioned closer to the signal lines in another sheet section or an external high-frequency circuit, causing crosstalk between them.

However, in the present preferred embodiment of the present invention, a first end of the first sheet section 105a is supported by the first bent sheet section 109a and the second bent sheet sections 111a and 111b. Here, the first bent sheet section 109a is situated in a different position from the second bent sheet sections 111a and 111b in the normal direction to the third principal surface (i.e., the x-axis direction). Moreover, in a plan view in the normal direction to the third principal surface, the first bent sheet section 109a is positioned between the second bent sheet sections 111a and 111*b*. In other words, unlike in the conventional art, the first end of the first sheet section 105*a* is supported by three different planes. As with the first end, a second end of the first sheet section 105*a* is supported by three different planes, i.e., the first bent sheet section 109*b* and the second bent sheet sections 111*c* and 111*d*. This configuration renders it possible to significantly reduce or prevent changes in shape of the bent sheet sections 109*a*, 109*b*, and 111*a* to 111*d* due to the weight and the size of the first sheet section 105*a*, shaking of the electronic device, etc. As a result, it is possible to inhibit the signal lines in each sheet section from being positioned close to the signal lines in another sheet section or an external high-frequency circuit, reducing crosstalk with them. That is, it is possible to significantly reduce or prevent variations in high-frequency characteristics among individual flexible boards 1.

Assuming here that the dimension of the conventional first sheet section 505*a* in the x-axis direction is lx, and the maximum dimension of the first sheet section 105*a* in the x-axis direction is also lx. In the example of FIG. 1, the value of lx is equal to the distance between the first bent sheet sections 109*a* and 109*b* in the x-axis direction. In this case, the distance between the second bent sheet sections 111*a* and 111*c* in the x-axis direction is less than lx. In addition, the distance between the second bent sheet sections 111*b* and 111*d* in the x-axis direction is also less than lx. With this configuration, it is possible to make the amount of deflection of the first sheet section 105*a* less than conventional. Accordingly, the portions of the signal lines 119*a* to 119*c* that are positioned on the first sheet section 105*a* are less likely to be positioned closer to other portions positioned on the first bent sheet sections 109*a* and 109*b* and the second bent sheet sections 111*a* to 111*d*. This also renders it possible to reduce the occurrence of crosstalk. That is, it is possible to significantly reduce or prevent variations in high-frequency characteristics among individual flexible boards 1.

Furthermore, in the above preferred embodiment, the signal lines 119*a* to 119*c* are configured so as to continue without breaks between opposite ends of the base 101 in the x-axis direction. On the other hand, the ground conductors 117*a* to 117*g* are not provided on any bending lines. Here, in the case where a plurality of typical striplines are arranged side by side, if ground conductors are discontinuous, it is difficult to ensure isolation at such breaks in the ground conductors. However, in the flexible board 1 of the present preferred embodiment (after bending), the portions of the signal line 119*b* that are positioned on the first bent sheet sections 109*a* and 109*b* are separated in the x-axis direction from both the portions of the signal line 119*a* that are positioned on the second bent sheet sections 111*a* and 111*c* and the portions of the signal line 119*c* that are positioned on the second bent sheet sections 111*b* and 111*d*. This configuration renders it possible to reduce the occurrence of crosstalk between the signal lines 119*a* to 119*c* even if the ground conductors 117*a* to 117*g* are not provided on the bending lines.

Note that in the above preferred embodiment, the transmission lines 113 are exemplified by tri-plate striplines. However, this is not limiting, the three transmission lines 113 may be microstrip lines or tri-plate striplines in the first sheet section 105*a* and the second sheet sections 107*a* and 107*b* and may be coplanar lines in the first bent sheet sections 109*a* and 109*b* and the second bent sheet sections 111*a* to 111*d*. More specifically, since the first bent sheet sections 109*a* and 109*b* and the second bent sheet sections 111*a* to 111*d* are bent, the coplanar structure in which conductors do not overlap in the thickness direction is preferable from the viewpoint of bendability.

Furthermore, the above preferred embodiment has been described with respect to the example where the ground conductors are not provided on any bending line. However, this is not limiting, and the ground conductors can be provided on all bending lines except at least one. Moreover, each line does not have to include any ground conductor. Examples of such a line include a power line and an antenna line.

First Modification

Figure 5:
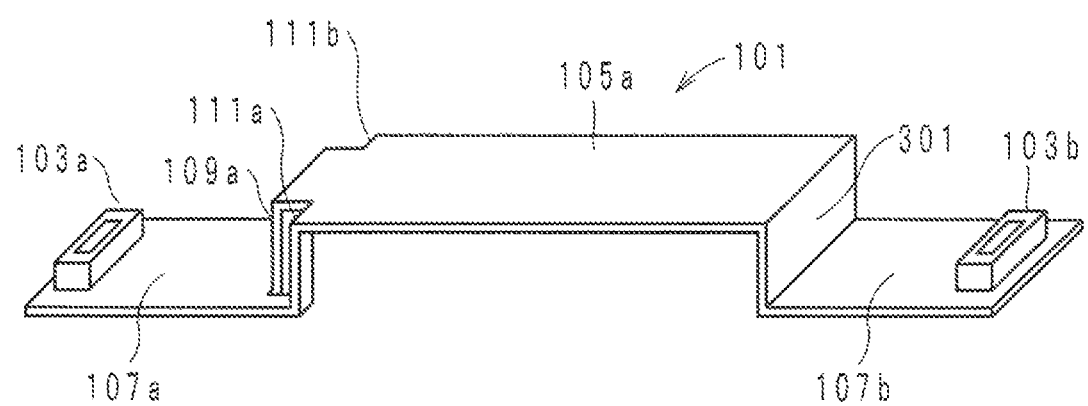
FIG. 5 is an oblique view illustrating a flexible board according to a first modification of a preferred embodiment of the present invention.
Figure 6:
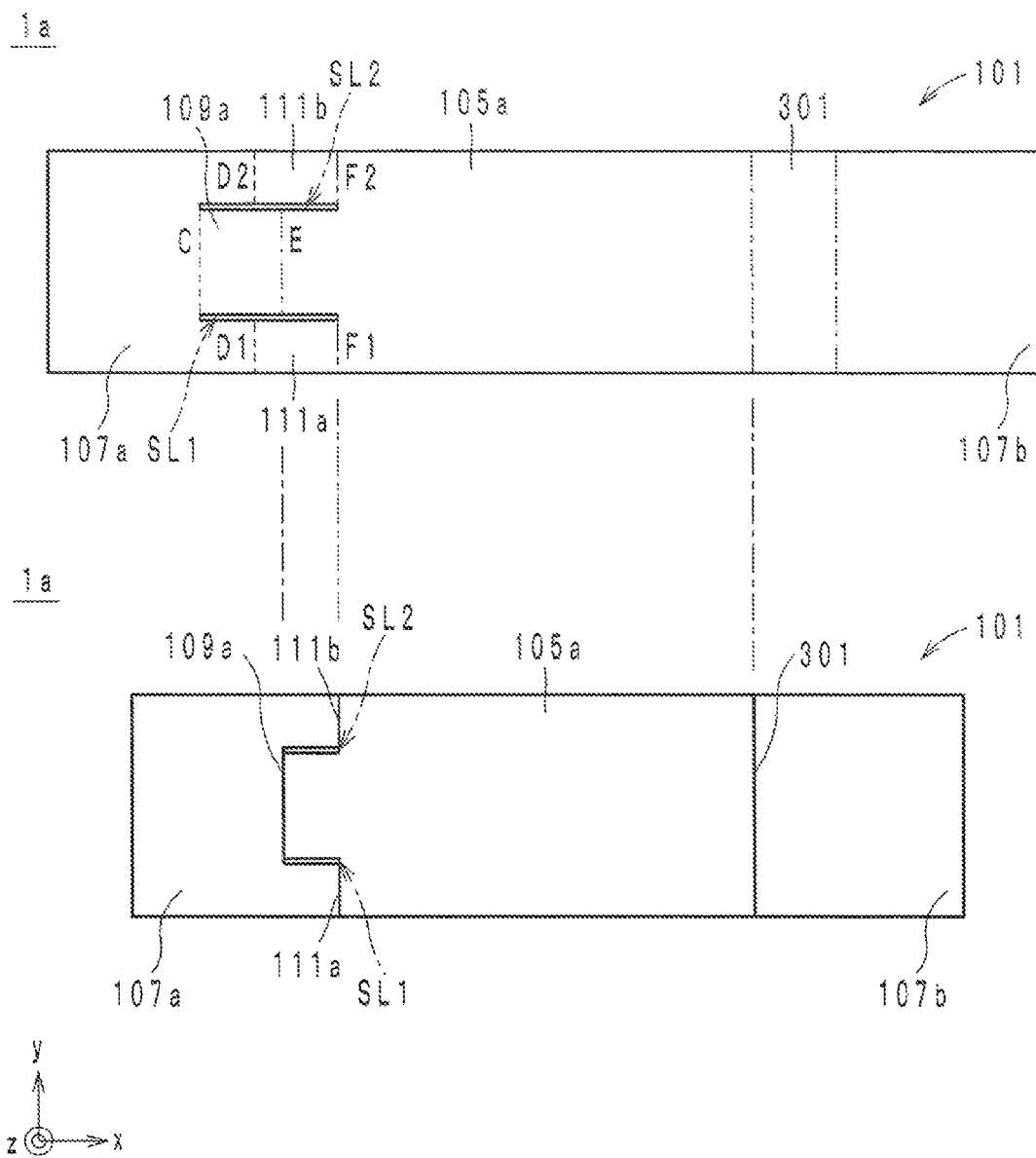
FIG. 6 provides top views of the flexible board in FIG. 5 (before and after bending)

In the above preferred embodiment, the base 101 of the flexible board 1 (after bending) preferably possesses symmetry with respect to vertical center plane A-A'. However, this is not limiting, and the base 101 may have a characteristic structure as described in the preferred embodiment, only on one side, as in a flexible board 1*a* shown in FIGS. 5 and 6. More specifically, the first sheet section 105*a* is supported at one end by the first bent sheet section 109*a* and the second bent sheet sections 111*a* and 111*b*, as shown in FIGS. 5 and 6. Moreover, the first bent sheet section 109*a* is provided in a different position from the second bent sheet sections 111*a* and 111*b* in the normal direction to the third principal surface (i.e., the x-axis direction). Moreover, when viewed in a plan view in the normal direction to the third principal surface, the first bent sheet section 109*a* is positioned between the second bent sheet sections 111*a* and 111*b*. On the other hand, the first sheet section 105*a* is connected at the other end to one end of the second sheet section 107*b* by a single bent sheet section 301.

Second Modification

Figure 7:
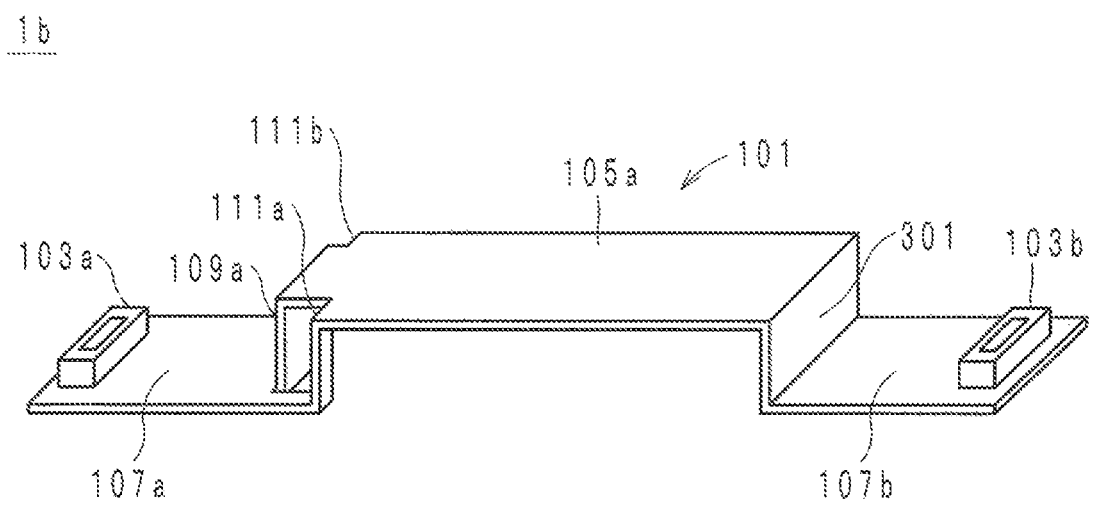
FIG. 7 is an oblique view illustrating a flexible board according to a second modification of a preferred embodiment of the present invention.
Figure 7:
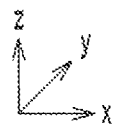
Figure 8:
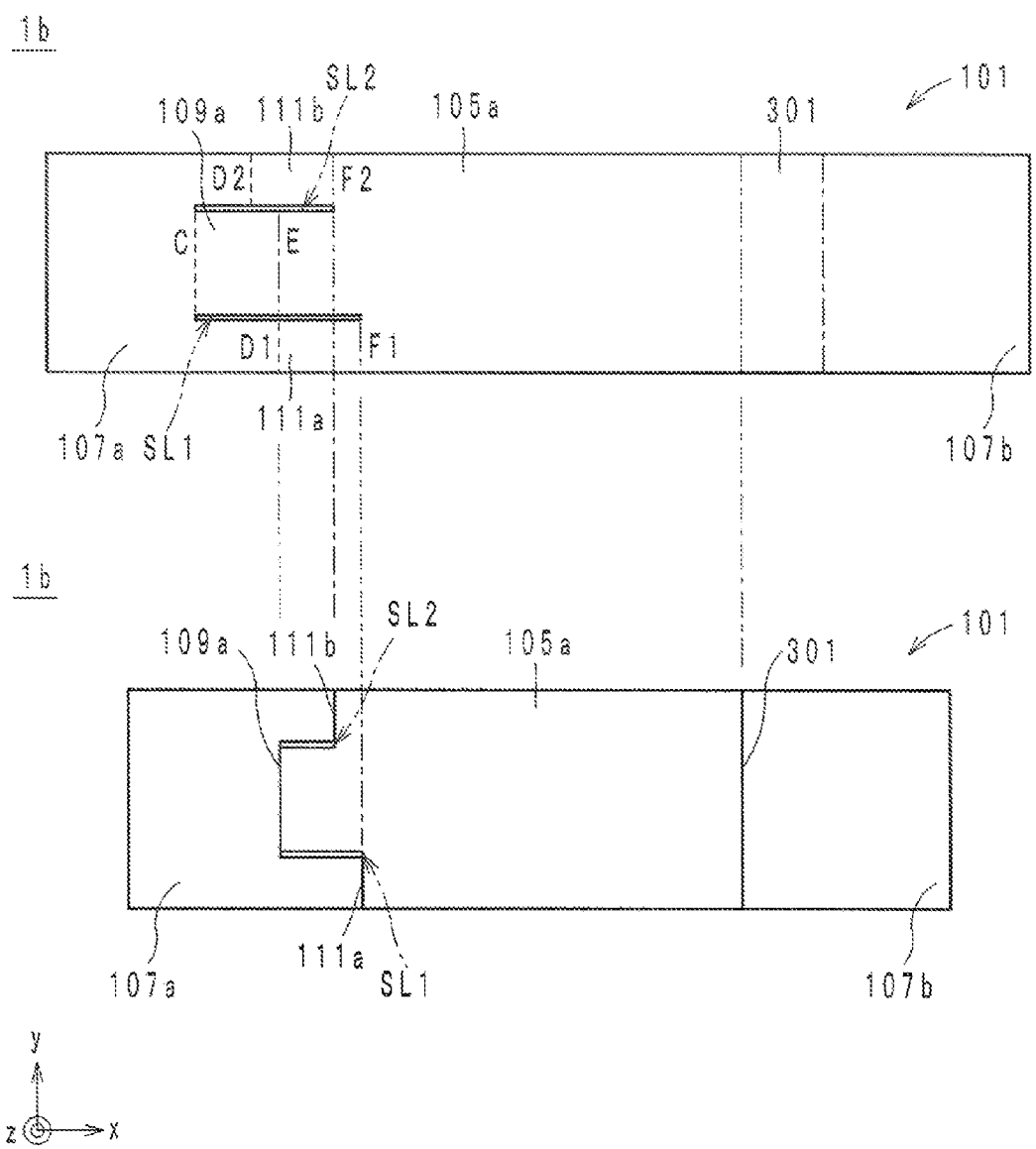
FIG. 8 provides top views of the flexible board in FIG. 7 (before and after bending).

In the first modification, the second bent sheet sections 111*a* and 111*b* of the flexible board 1*a* (after bending) preferably are situated in the same position with respect to the first bent sheet section 109*a* in the normal direction to the third principal surface. However, this is not limiting, and the second bent sheet sections 111*a* and 111*b* may be provided in different positions with respect to the first bent sheet section 109*a* in the normal direction to the third principal surface, as in a flexible board 1*b* (after bending) shown in FIGS. 7 and 8.

In this manner, the first bent sheet section 109*a* and the second bent sheet sections 111*a* and 111*b* are situated in different positions from one another in the normal direction to the third principal surface, such that their positions do not coincide in the normal direction. As a result, it is possible to further significantly reduce or prevent changes in shape of the bent sheet sections 109*a*, 111*a*, 111*b*, and 301. Thus, the occurrence of crosstalk is further reduced or prevented.

Third Modification

Figure 9:
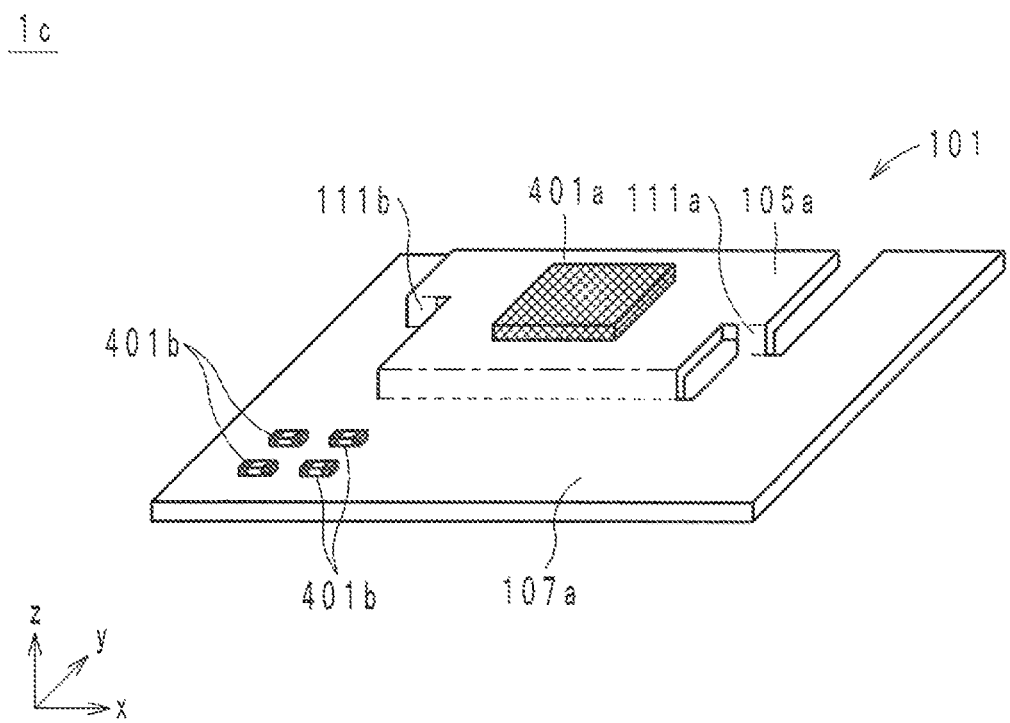
FIG. 9 is an oblique view illustrating a flexible board according to a third modification of a preferred embodiment of the present invention.
Figure 10:
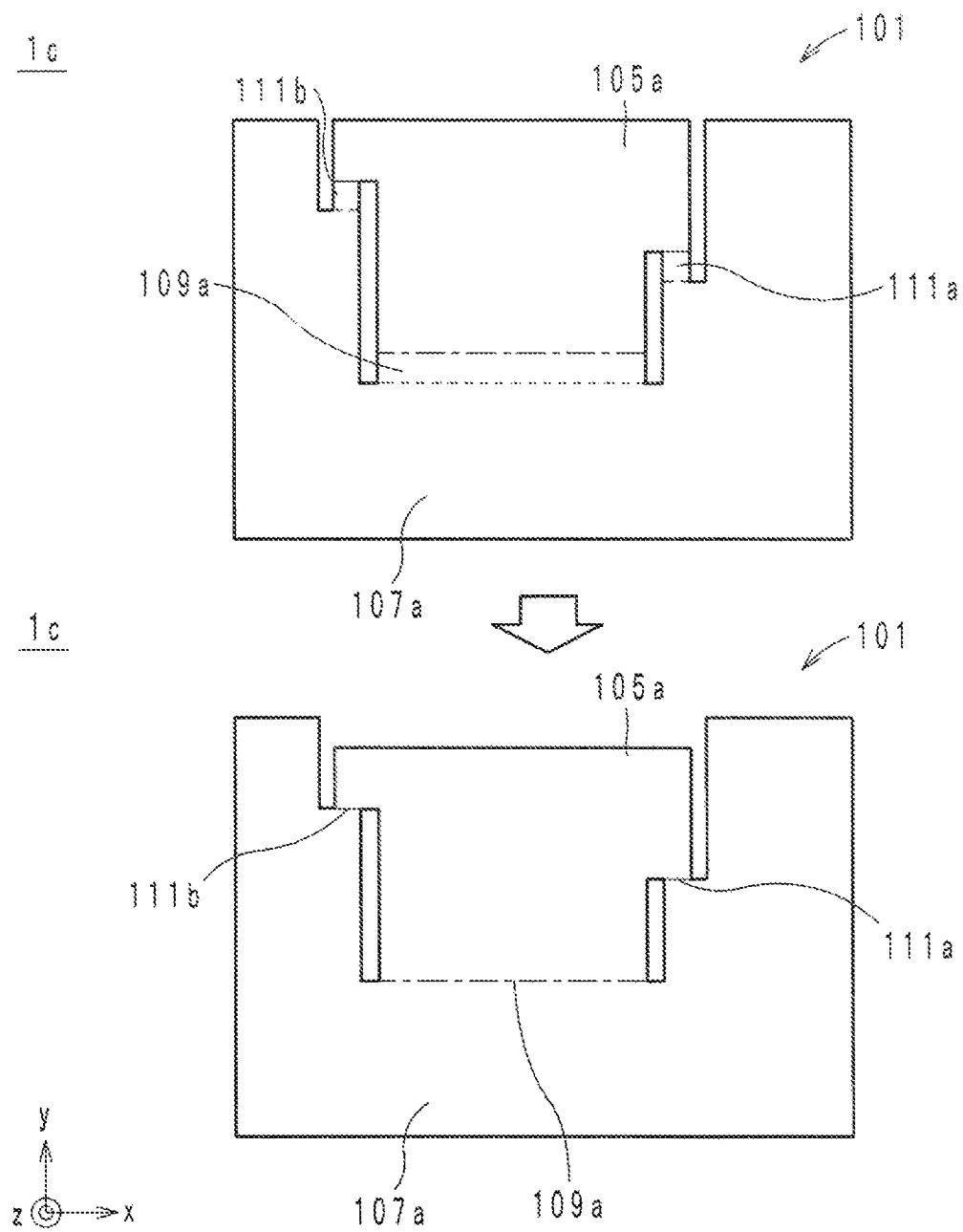
FIG. 10 provides top views of the flexible board in FIG. 9 (before and after bending).

The above preferred embodiment has been described with respect to the flexible board 1, which is a so-called flat cable. However, the flat cable is merely an illustrative example, and the flexible board may be provided in the form of a module (or a submodule) such as a flexible board 1*c* shown in FIG. 9, in which surface-mount components 401*a* and 401*b*, such as an IC chip and passive components, are mounted on the first sheet section 105*a* and the second sheet section 107*a* included in the base 101. FIG. 10 provides plan views of the flexible board 1*c* as seen in the z-axis direction, where the upper and lower portions show the flexible board 1*c* before and after bending, respectively.

As described above, this configuration is resistant to deformation of the first bent sheet section 109*a* and the second bent sheet sections 111*a* and 111*b*, and therefore, even when the components 401*a* and 401*b* are mounted on the first sheet section 105*a* and the second sheet section 107a, it is possible to prevent the occurrence of crosstalk as well as deformation of the base 101 under the weight of the component 401a, etc.

Note that in the above preferred embodiment and modifications, the first bent sheet sections 109a and 109b, when viewed in a plan view from the positive side in the z-axis direction, preferably protrude so as to be convex with respect to the first sheet section 105a. However, this is not limiting, and the first bent sheet sections 109a and 109b may be recessed so as to be concave with respect to the first sheet section 105a.

Although the present invention has been described in connection with the preferred embodiments and modifications thereof above, it is to be noted that various changes and modifications are possible to those who are skilled in the art. Such changes and modifications are to be understood as being within the scope of the invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible board comprising:
   a first sheet section including a first principal surface;
   a second sheet section including a second principal surface and provided in a different position from the first principal surface in a normal direction to the first principal surface;
   a first bent sheet section configured to connect ends of the first and second sheet sections, the first bent sheet section including a third principal surface not parallel to the first and second principal surfaces;
   a second bent sheet section including a fourth principal surface and provided in a different position from the third principal surface in a normal direction to the third principal surface;
   a signal line provided in or on the first sheet section, the second sheet section, and one of the first bent sheet section and the second bent sheet section; and
   a ground conductor provided in or on the first sheet section, the second sheet section, and the one of the first bent sheet section and the second bent sheet section, so as to be parallel or substantially parallel to the signal line; wherein
   the ground conductor is disposed so as not to be positioned at a connection between the first sheet section and the first bent sheet section and a connection between the second sheet section and the first bent sheet section or so as not to be positioned at a connection between the first sheet section and the second bent section and a connection between the second sheet section and the second bent sheet section.

2. The flexible board according to claim 1, further comprising a signal line provided in or on the first sheet section, the second sheet section, and the other one of the first bent sheet section and the second bent sheet section.

3. The flexible board according to claim 1, wherein the first principal surface and the second principal surface are parallel or substantially parallel to each other.

4. The flexible board according to claim 2, wherein the first principal surface and the second principal surface are parallel or substantially parallel to each other.

5. The flexible board according to claim 1, wherein the first sheet section, the second sheet section, the first bent sheet section, and the second bent sheet section are defined by bending one flexible base.

6. An electronic device comprising:
   the flexible board according to claim 1; and
   at least two high-frequency circuits connected by the flexible board.

* * * * *